United States Patent Office 3,573,975
Patented Apr. 6, 1971

3,573,975

PHOTOCHEMICAL FABRICATION PROCESS

Vir A. Dhaka and Edwin R. Clark, Poughkeepsie, and Arnold Pinck, Wappingers Falls, N.Y., assignors to International Business Machines Corporation, Armonk, N.Y.

No Drawing. Filed July 10, 1968, Ser. No. 743,596
Int. Cl. G03c 5/00
U.S. Cl. 117—212 18 Claims

ABSTRACT OF THE DISCLOSURE

In a photochemical fabrication process wherein a photoresist layer is image-wise exposed by contact exposure through a mask, the improvement of providing a liquid interface between the photoresist layer and mask prior and during exposure.

The present invention relates to photochemical fabricating processes.

BACKGROUND OF THE INVENTION

Photochemical fabricating processes are widely used in various arts. For example, they are commonly employed in the electronic arts for preparing printed circuits and components such as semiconductors. They are also commonly used in the graphic arts for preparing typographic, litho-graphic and gravure printing plates.

In conventional photochemical fabricating processes, the object or substrate to be etched, coated or otherwise treated is coated with a suitable photoresist. A photoresist is a material which is irreversibly altered as to its chemical or crystallographic constitution upon exposure to light of a particular type, usually ultraviolet (UV). The photoresist coated substrate is then image-wise exposed, usually by contact exposure, until the exposed photoresist is insolubilized or "hardened" in the exposed areas in the case of a negative acting resist or solubilized in the case of a positive acting resist. The soluble photoresist is then washed away or "developed" with a suitable solvent and the object is treated in the exposed areas with either an etchant to remove part of the substrate material or coated with an additional layer or otherwise treated.

Conventionally, the image-wise contact exposure is effected by placing a mask having the desired pattern therein over the substrate and exposing the photoresist with ultraviolet light or other suitable light through the mask.

The prior art is faced with a number of problems in connection with this contact exposure phase of the photochemical fabricating processes. Thus, if the substrate or mask is not smooth or irregularly contoured, the "air spaces" formed between the mask and substrate will result in poor resolution during exposure because of light refraction in these air spaces. Moreover, the oxygen contained in the air in these spaces will react with the photoresist during exposure thereby lessening the sharpness of the "image." These two disadvantages in the prior art processes make them unsuitable where very fine definition is required.

Moreover, the same masks are used over extended periods of time to produce many objects. Continuous aligning procedures in use with contact printing result in deterioration of these masks due to friction between the substrate and the mask surface. Likewise, this friction results in deterioration of the surface of the substrate to be treated.

It has been proposed to conduct the alignment and exposure steps in an inert atmosphere such as nitrogen in order to reduce the oxidative effects of air. However, these techniques are ineffective for solving the problem of undue wear on the materials due to friction.

It has also been proposed to interpose a viscous, lubricating fluid between the mask and substrate during alignment and exposure. Liquids employed have been mineral oils, etc. Although acting as a lubricant, these viscous materials are non-volatile and hard to remove after the exposure steps. They necessitate heat drying etc., and often leave deposits or residues following this removal. Moreover, due to their high viscosity they can only be laid down in relatively thick layers between the mask and substrate, thereby aggravating the problem of increased light refraction under the mask.

It is an object of the present invention to provide a photochemical fabricating process wherein the problems connected with the prior art processes are avoided.

It is a further object of the present invention to provide a photochemical fabricating process whereby a high degree of resolution or definition can be obtained upon contact exposure of the photoresist coated substrate.

It is a further object of the present invention to provide a photochemical fabricating process whereby mask wear and substrate wear is minimized.

BRIEF DESCRIPTION OF INVENTION

These and other objects are achieved according to the present invention by providing a special liquid interface between the substrate and mask during the alignment and exposure steps. This special liquid interface greatly improves the conventional photo treating processes in a variety of ways.

DETAILED DESCRIPTION OF INVENTION

The liquid interface is one having a refractive index substantially identical to that of the mask, a relatively high volatility, a relatively low viscosity, does not leave a residue upon evaporation and exerts no solvent action on the various mask and substrate surfaces.

By using a liquid having a refractive index matching that of the mask and substrate light refraction in empty spaces caused by irregular surfaces is avoided. As a result, the ultraviolet light is prevented from refracting and exposing portions of the photoresist coated substrate which are not meant to be exposed. Thus, a higher degree of resolution and definition is achieved.

Moreover, the liquid interface prevents the reaction between oxygen in the air and the photoresist during ultraviolet exposure thereby contributing to the degree of resolution and definition.

Also, the lubricating action of the liquid interface considerably lessens the deterioration of the photographic mask and substrate surfaces due to the lessened degree of friction therebetween during alignment and exposure steps. This lubricating action more than doubles the usable life of the photographic masks.

Any liquid which is inert with respect to the photographic mask and photoresist and which permits passage therethrough of the light necessary to expose the photoresist may be employed. Those liquids satisfying the above requirements are the lower alcohols such as methanol, ethanol and isopropanol, when used with negative acting photoresists such as KPR, KTFR, KOR, etc., and water when used with positive photoresists such as Shipley AZ 1350 and AZ 11.

It must be understood that those liquids having an extremely high volatility such as the lower ethers, Freon, etc., require the utilization of special equipment inasmuch as they would evaporate during the alignment and exposure steps giving rise to increased friction.

Isopropanol is the preferred liquid combining the optimum of the above described properties.

Generally, it is preferred to employ liquids having a refractive index substantially the same as that of the mask. It is to be understood, however, that the refractive index of the liquid is not critical in instances where high resolution and definition are not necessary but where only the lubricating action of the liquid interface is important. Any inert alcohol or water regardless of its refractive index may then be employed.

The refractive index of all liquids is greater than air and hence, the use of any liquid where lubricity is not essential would bring the refractive indices of the spaces between the mask and substrate closer to those of the masks.

Also, it is preferred to employ liquids which are not highly viscous in order to obtain a very thin film between the mask and substrate. The use of highly viscous oils, while suitable to afford a lubricating action, are deposited only in very thick films which lessens somewhat the degree of resolution and definition due to increased light refraction. Thick, viscous films also give rise to a "gluing action" between the mask and substrate rendering it difficult to separate them and to clean them. The use of low boiling, volatile solvents such as Freon having a great tendency to evaporate during the alignment and exposure steps necessitate pauses in the process to replenish the liquid supply. To avoid shutdowns, closed systems embodying means for the continuous injection of volatile liquids should be employed when using low-boiling liquids.

The liquid may be coated on the substrate by any conventional method such as roller, brush or spray coating. Alternatively, the liquid may be poured over the substrate and the latter subjected to centrifugal force to remove excess liquid.

It is obvious that the selection of a suitable liquid will depend on the particular photochemical fabricating process contemplated. Obviously, a liquid suitable for use in one particular process will not be adapted for use in other processes.

The invention is particularly applicable in the field of integrated circuits. A typical process would involve applying a photoresist layer to a silicon dioxide coated silicon substrate. Following alignment with and exposure through a suitable mask, the exposed portions of the photoresist layer are developed with a solution which either hardens the exposed area and washes away the unexposed portions or hardens the unexposed area while washing away the exposed portions. The exposed silicon dioxide layer is then etched away to expose the underlying silicon substrate. The exposed silicon areas may then be doped or metallized. Following this operation the surface may again be coated partially or completely with an additional electrically active layer. The entire photochemical fabrication process may again be repeated on this new surface to effect the positioning of other components in or on the substrate, either isolated from or connected to the previously placed components.

The invention will be described with respect to a process for processing semiconductor materials; however, it is to be understood that this invention is applicable to any photochemical fabricating process involving the alignment and exposure of any photoresist coated substrates.

Example 1

A semiconductor wafer containing an $SiO_2$ insulating coating was coated with a KTFR polymeric negative acting photoresist and baked at 75° C. The photoresist layer was then coated with a thin layer of isopropanol and a positive mask aligned thereover. The assembly was then exposed using ultraviolet light and the unexposed portions of the substrate washed away. The produced image was much sharper than those produced where no isopropanol was employed.

The same mask was used repeatedly in multiple alignment and exposure procedures employing an isopropanol interface. Wear due to friction was greatly lessened over those procedures where no liquid interface was employed.

Moreover, the surfaces contacted with isopropanol were easiy cleaned by simply allowing evaporation. No residue was left on the surfaces of the masks or substrates.

Example 2

The process of Example 1 was repeated employing a Shipley AZ 1350 positive acting resist (polymeric composition containing diazo groups), a positive mask and a water interface therebetween with similarly good results.

Although the invention has been illustrated by examples involving the preparation of a semiconductor wafer materials, it is to be understood that the invention is equally applicable to any photochemical fabricating process whereby a substrate is coated with a photoresist and image-wise exposed using a mask.

We claim:

1. In a photochemical fabrication process wherein a semiconductor material is sequentially coated with a material selected from the group consisting of an electrically active coating and an insulating coating and then coated with a photoresist, is aligned with and imagewise exposed by contact exposure through a mask having completely opaque and transparent areas thereon, which opaque areas completely prohibit the passage of light and which transparent areas permit complete passage of light, the improvement which comprises providing an inert lubricating liquid interface consisting essentially of a member selected from the group consisting of a lower aliphatic alcohol and water between said substrate and said mask during said alignment and exposure steps, wherein said liquid has a refractive index substantially identical to that of said mask.

2. The process of claim 1 wherein said substrate comprises a semiconductor material coated with an electrically active coating.

3. The process of claim 1 wherein said substrate comprises a semiconductor material coated with an insulating coating.

4. The process of claim 1 wherein said photoresist layer is a negative acting resist and said liquid is a lower alcohol.

5. The process of claim 4 wherein said negative acting resist, is, prior to providing said inert lubricating liquid interface between said substrate and said mask, baked to harden said resist, and further wherein said resist is etched prior to said alignment and exposure steps.

6. The process of claim 4 wherein said alcohol is selected from the group consisting of methanol, ethanol and propanol.

7. The process of claim 4 wherein said alcohol is isopropanol.

8. The process of claim 1 wherein said photoresist layer is positive acting resist and said liquid is water.

9. The process of claim 1 wherein said image-wise exposure is by means of ultraviolet light, and further wherein reaction between said photoresist and oxygen in the air is prohibited by said inert liquid, thereby improving resolution and definition.

10. The process of claim 9 wherein said liquid interface is provided between said substrate and said mask by coating only said substrate prior to contact exposure.

11. In a photochemical process for the preparation of integrated circuits including the steps of coating a semiconductor substrate with an electrically active material, coating said electrically active material with a photoresist layer, aligining said photoresist layer with an imagewise exposing said photoresist layer by contact exposure through a mask having completely opaque and transparent areas thereon which opaque areas completely prohibit the passage of light and which transparent areas permit complete passage of light, removing said mask, developing said exposed photoresist layer to expose a portion of the electrically active coating corresponding to said image in treating said exposed electrically active layer and underlying substrate to render the electrical characteristics thereof different from those of the exposed portions of the electrically active coating and underlying substrate, the improvement comprising providing an inert lubricating interface consisting essentially of a member selected from the group consisting of lower aliphatic alcohols and water between said photoresist layer and said mask during said alignment and exposure steps, wherein said liquid has a refractive index substantially identical to that of said mask.

12. The process of claim 11 wherein said photoresist layer is a negative acting photoresist.

13. The process of claim 11 wherein said photoresist layer is a positive acting resist and said liquid is water.

14. The process of claim 11 wherein said alcohol is selected from the group consisting of methanol, ethanol and propanol.

15. The process of claim 11 wherein said alcohol is isopropanol.

16. The process of claim 11 wherein said image-wise exposure is by means of ultraviolet light, and further wherein reaction between said photoresist and oxygen in the air is prohibited by said inert liquid, thereby improving resolution and definition.

17. The process of claim 11 wherein said liquid interface is provided between said substrate and said mask by coating only said substrate prior to contact exposure.

18. The process of claim 11 which further comprises, subsequent to developing said exposed photoresist layer to expose a portion of the electrically active coating and treating said exposed electrically active layer, repeating the process steps of claim 11.

References Cited

Stott, Cummins, Breton, "Printing Motion-Picture Films Immersed in a Liquid," Journal of the SMPTE, vol. 66, October 1957, pp. 607–615.

Delwiche, Clifford, Weller, "Printing Motion-Picture Films Immersed in a Liquid," Journal of the SMPTE, vol. 67. October 1958, pp. 678–686.

ALFRED L. LEVITT, Primary Examiner

A. GRIMALDI, Assistant Examiner

U.S. Cl. X.R.

96—36, 36.2; 117—5.5